United States Patent [19]
Yoo et al.

[11] Patent Number: 5,622,889
[45] Date of Patent: Apr. 22, 1997

[54] HIGH CAPACITANCE CAPACITOR MANUFACTURING METHOD

[75] Inventors: Cha-young Yoo; Young-sun Kim; Young-wook Park; Se-jin Shim, all of Kyungki-do, Rep. of Korea

[73] Assignee: Samsung Electronics Co., Ltd., Suwon, Rep. of Korea

[21] Appl. No.: 591,391

[22] Filed: Jan. 25, 1996

[30]     Foreign Application Priority Data

Jan. 26, 1995 [KR]   Rep. of Korea ................. 95-1413

[51] Int. Cl.⁶ ...................................... H01L 21/70
[52] U.S. Cl. .................. 438/397; 438/398; 438/738
[58] Field of Search ........................ 437/47, 52, 60, 437/919; 148/DIG. 14

[56]            References Cited

U.S. PATENT DOCUMENTS

| | | |
|---|---|---|
| 5,366,917 | 11/1994 | Watanabe et al. ............... 437/919 |
| 5,447,878 | 9/1995 | Park et al. ............... 437/52 |
| 5,486,488 | 1/1996 | Kamiyama ............... 437/919 |

OTHER PUBLICATIONS

Sakao, M., "A Capacitor–Over–Bit–Line (COB) Cell With A Hemispherical–Grain Storage Node for 64Mb DRAMs", IEDM 90–655, IEEE 1990, pp. 27.3.1–27.3.4.

*Primary Examiner*—Tuan H. Nguyen
*Attorney, Agent, or Firm*—Cushman Darby & Cushman, IP Group PF Pillsbury Madison & Sutro LLP

[57]            ABSTRACT

A method for manufacturing a high capacitance capacitor having an HSG film formed on a stack-structured lower storage node, includes the step of forming insulating films for protecting the HSG film. In the present invention the lower storage node and the HSG film formed thereon are not damaged during an etch-back process. The HSG film formed on the lower storage node is protected by means of the insulating films, thereby preventing a decrease in capacitor capacitance.

5 Claims, 3 Drawing Sheets

HIGH CAPACITANCE CAPACITOR MANUFACTURING METHOD

BACKGROUND OF THE INVENTION

The present invention relates to a semiconductor device and, more particularly, to a method for manufacturing a high capacitance capacitor having a hemispherical grain (HSG) film formed on a lower storage node of a stack structure. The HSG film is formed on the overall surface of a substrate except that the lower storage node can be removed without damaging the HSG film formed on the lower storage node.

The basic principle and structure of a capacitor is simple. The capacitor is comprised of two metal plates facing each other and an insulator (generally, referred to as a dielectric) inserted between them. The importance of the capacitor in a semiconductor device is its ability to store charge. Most data that we use are expressed in terms of binary digits, i.e. ones or zeros. That is, ones and zeros correspond to the absence and presence of current or voltage, respectively, in electrical terms. Without a device to store charge, the data could not be expressed.

The discrete components which constitute a semiconductor device have gotten smaller as the integration level of the semiconductor device has increased. The discrete components used in a semiconductor device have different functions according to their usages. For example, a capacitor simply functions as a storage of charge while some capacitors function to store and express useful data, like a memory cell. Although there are functional differences between capacitors depending on their usages, the capacitors should satisfy the requirement of large charge-storage capacities, namely, large capacitor capacitances.

By making a capacitor's capacitance as large as possible with a relatively small size, the capacitance is increased, in a real sense. Capacitors small in size, yet having large capacitance are needed in present day semiconductor devices. Indeed, a way for increasing a capacitor's capacitance is urgently needed for today's semiconductor devices. In semiconductor devices, as the integration level has increased the available area for capacitors has decreased, while the required capacitance of the semiconductor device has not decreased. Therefore, there have been continuous studies on ways to increase the effective area of a capacitor. Most of the storage node structures of capacitors which are currently widely used and have large effective areas are three-dimensional. To ensure sufficient capacitance for a semiconductor memory device, the effective surface area of a storage node must be increased and, for this purpose, the storage node structure should be three-dimensional.

There are limitations, however, on changing the storage node structure in practice. In the case where the storage node is formed too high, many problems arise in relation to step height in the subsequent process for forming a dielectric film. In another case where the volume of the storage node is increased horizontally, problems relating to contact with adjacent storage nodes arise. Further, because of process complexity there has been difficulty in achieving a desired storage node structure, in practice. Three-dimensional storage node structures which have been developed so far are stack, fin and cylindrical ones. They are advantageous with respect to capacitance, but their manufacturing processes are complicated. To manufacture a storage node having a maximum effective area with a simple manufacturing process, a simple three-dimensional stack-structured storage node having an HSG film deposited thereon has been recently invented. If an HSG is ideally deposited on a unit area, at least two unit effective areas are obtained. As a result, a capacitor having a storage node structure where HSGs are deposited ensures greater capacitance when other factors, i.e. the dielectric constant and the distance between plates, are constant.

However, a capacitor using a storage node structure involving an HSG film has not been desirable, in practice, since HSGs can be controlled only indirectly with the help of complex equipment. An example of a capacitor using a storage node structure involving an HSG film is shown in "A Capacitor-Over-Bit-Line (COB) cell with a hemispherical-grain storage node for 64 Mb DRAMs: IEDM, 1990, pp.655–658." For an HSG film to be used in a capacitor, a conductive impurity must be implanted into the HSG film. There are two currently used methods: one involves direct ion-implantation into the HSG film and the other involves implanting the conductive impurity earlier into a lower storage node which then diffuses into the HSG film. Therefore, the formed size of the HSGs depends on whether the surface of the lower storage node is planar or curved. Further, it is impossible to form HSGs only in a predetermined area. Thus, an HSG film formed between storage nodes must be removed to ensure capacity reliability. In the removal process, the lower storage node and the HSG film formed thereon are frequently damaged, resulting in a decrease in capacitance of the capacitor.

A conventional method for manufacturing a capacitor having an HSG film on a stack-structured storage node will now be described in detail, referring to the attached drawings.

FIGS. 1 through 4 illustrate the steps for manufacturing a capacitor according to the conventional method.

FIG. 1 shows the step of forming insulating layers including a contact hole. As shown in FIG. 1, a first insulating film 3, a second insulating film 5 and a third insulating film 7 are sequentially formed on a semiconductor substrate 1 including a transistor (not shown). A photoresist (not shown) is coated on third insulating film 7 and patterned. The portions of first insulating film 3, second insulating film 5 and third insulating film 7 exposed by the photoresist pattern are sequentially etched, thereby forming a contact hole 9. A spacer 11 is formed on a sidewall of contact hole 9 and then the photoresist pattern is removed. Second insulating film 5 is formed of a nitride film and third insulating film 7 is formed of an oxide film.

FIG. 2 shows the step of defining a lower storage node pattern. As shown in FIG. 2, an in-situ doped polysilicon layer 13 (hereinafter, referred to as a conductive layer) is formed on the overall surface of contact hole 9 and third insulating film 7 shown in FIG. 1. A photoresist (not shown) is coated on the overall surface of conductive layer 13. Thereafter, a photoresist pattern 15 is formed by patterning the photoresist, to thereby define a storage node.

FIG. 3 shows the step of forming the HSG film. As shown in FIG. 3, conductive layer 13 is dry-etched by using photoresist pattern 15, shown in FIG. 2, as a mask, thereby forming lower storage nodes 14. The etching is performed until the interface of third insulating film 7 is exposed. Thereafter, photoresist pattern 15 is removed and an HSG film 17 is deposited on the overall surfaces of lower storage nodes 14. To implant a conductive impurity into HSG film 17, the resultant structure on which HSG film 17 has been deposited and the overall surfaces of lower storage nodes 14, are subjected to thermal processing. Thus, the conductive impurity of lower storage nodes 14 is implanted into HSG film 17 by diffusion.

FIG. 4 shows the step of removing the HSG film formed on the overall surface of substrate 1 except for lower storage nodes 14. As shown in FIG. 4, HSG film 17 formed on the overall surface of substrate 1, except for lower storage nodes 14 in FIG. 3, is removed by anisotropic etching. In this step, not only lower storage node 14 but HSG film 12 formed thereon is damaged, thereby decreasing the capacitance of the capacitor. Then, a high dielectric film (not shown) is formed on the overall surface of lower storage node 14 by usual methods, and an upper storage node (not shown) is formed on the high dielectric film. Thus, the capacitor is completed.

In the conventional capacitor manufacturing method, the manufacturing process is simple and the HSG film can be formed to be large by employing the stack-structured lower storage node. Thus, it is advantageous in that the effective area of a capacitor can be maximized. However, when removing the HSG film formed between adjacent lower storage nodes, the lower storage node and the HSG film formed thereon are damaged, thereby decreasing the capacitance of the capacitor.

SUMMARY OF THE INVENTION

The object of the present invention is to provide a high capacitance capacitor manufacturing method in which an oxide film is used to protect an HSG film on a lower storage node of a capacitor when removing an HSG film formed on the overall surface of a substrate except for the lower storage node.

To achieve this object, a high capacitance capacitor manufacturing method includes the following steps:

forming a first insulating film including a contact hole on the overall surface of a semiconductor substrate;

forming a first conductive layer on the first insulating film while burying the contact hole;

forming a first HSG film on the overall surface of the first conductive layer;

sequentially forming a second insulating film and a third insulating film on the overall surface of the first HSG film;

patterning the second insulating film and the third insulating film, etching the first HSG film and the first conductive layer by using the patterned third insulating film and second insulating film as a mask, and forming a lower storage node having the first conductive layer and the HSG film;

forming a second HSG film on the overall surface of the resultant obtained in the step of forming the lower storage node;

removing the second HSG film formed on the overall surface of the substrate except for the lower storage node; and removing the first insulating film to a predetermined depth and the second insulating film.

The first insulating film has a multi-layer structure comprised of three insulating films. The first film of the multi-layer structure is formed by a high temperature oxide (HTO), a PST or an undoped silica glass (USG), at a thickness of 100–3,000 Å. The second film of the multi-layer structure is formed by a nitride film. The third film of the multi-layer structure is formed by a borophosposilicate glass (BPSG) film, an USG film, or an HTO film, at a thickness of 1,000–15,000 Å.

Preferably, the first conductive layer is formed to a thickness of 3,000–10,000 Å. The first HSG film and the second HSG film are formed so that the grain size and diameter is 300–1,000 Å.

The second insulating film is formed of an HTO film and the third insulating film is formed of a polysilicon layer or a nitride layer.

According to the present invention, HSGs can be formed to be large by forming the lower storage node in a stack structure. The first HSG film is formed on the lower storage node and the second HSG film is formed on a sidewall of the lower storage node. When removing the second HSG film formed on the overall surface of the substrate except for the lower storage node, the first HSG film on the lower storage node is protected by the second insulating film. Thus, the lower storage node and the first HSG film thereon are protected from being damaged. Consequently, a decrease in the capacitor's capacitance can be prevented.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE INVENTION

An embodiment of the present invention will now be described in detail with reference to FIGS. 5–11.

Figure 1:
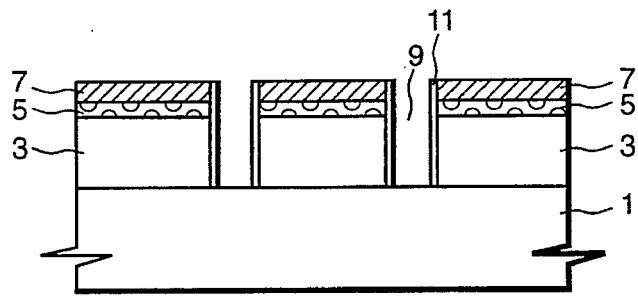
FIGS. 1 through 4 illustrate the steps for manufacturing a capacitor according to a conventional method.
Figure 2:
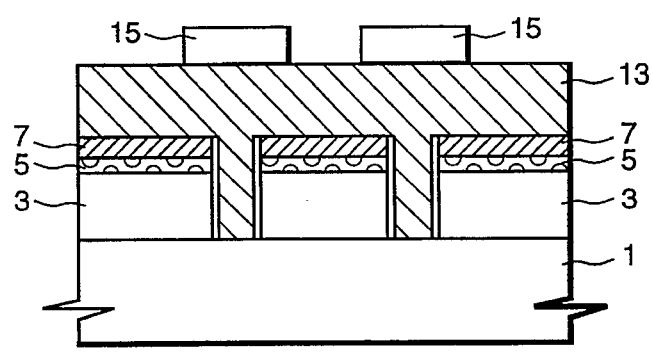
Figure 3:
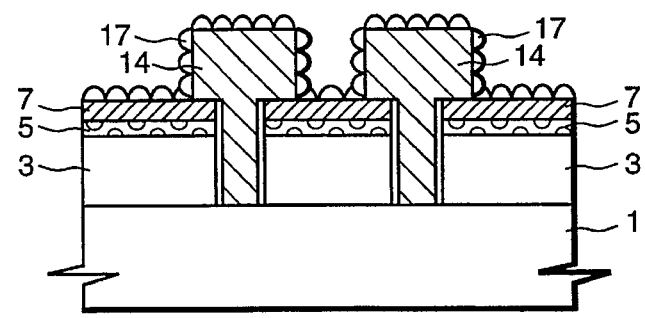
Figure 4:
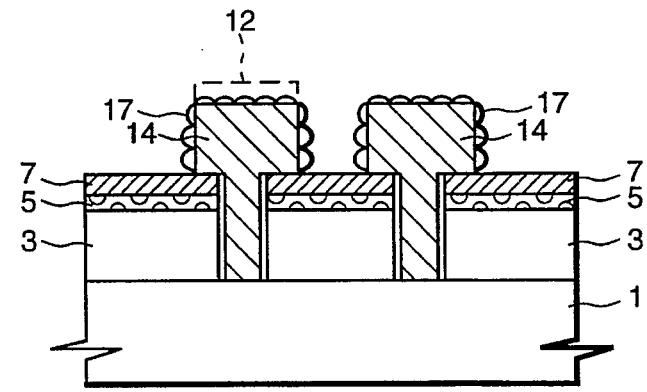
Figure 5:
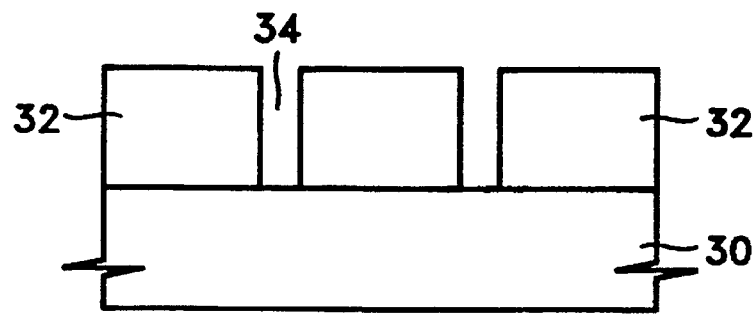
FIGS. 5 through 11 illustrate the steps for manufacturing a capacitor according to the present invention.

FIG. 5 shows the step of forming first insulating film 32 having contact hole 34. As shown in FIG. 5, first insulating film 32 is formed on the overall surface of semiconductor substrate 30 including a transistor (not shown). First insulating film 32 has a multi-layer structure comprised of three films. A first film of the multi-layer structure is formed of BPSG, USG or HTO and 1,000–15,000 Å thick. A second film of the multi-layer structure is formed of a nitride film. The third film of the multi-layer structure is formed of HTO, PSG or USG and 100–3,000 Å thick.

A photoresist (not shown) is coated on the overall surface of first insulating film 32 and then a photoresist pattern is formed to define contact hole 34. First insulating film 32 is anisotrophically etched by using the photoresist pattern, thereby forming contact hole 34. Thereafter, spacer 36 is formed on a sidewall of contact hole 34 and the photoresist pattern is removed.

Figure 6:
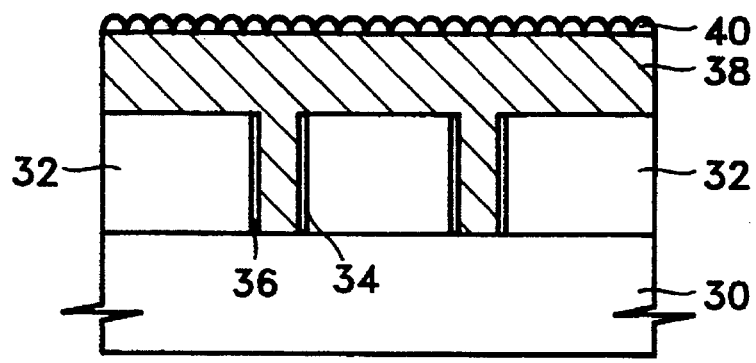

FIG. 6 shows the step of forming first HSG film 40. As shown in FIG. 6, polysilicon layer 38 is formed on the overall surface of first insulating film 32 while burying contact hole 34. Polysilicon layer 38 is deposited to be 3,000–10,000 Å thick. The conductive impurity implanted into polysilicon layer 38 (hereinafter, referred to as a first conductive layer 38) will be ion-implanted into first HSG film 40 by external diffusion, in a subsequent process. First HSG film 40 is formed on the overall surface of first conductive layer 38. The diameter of the grains constituting first HSG film 40 is 300–1,000 Å. When the resultant structure, in which first HSG film 40 has been deposited, is subjected to thermal processing, the conductive impurity of first conductive layer 38 diffuses outward. Thus, first HSG film 40 can be doped with the conductive impurity.

Figure 7:
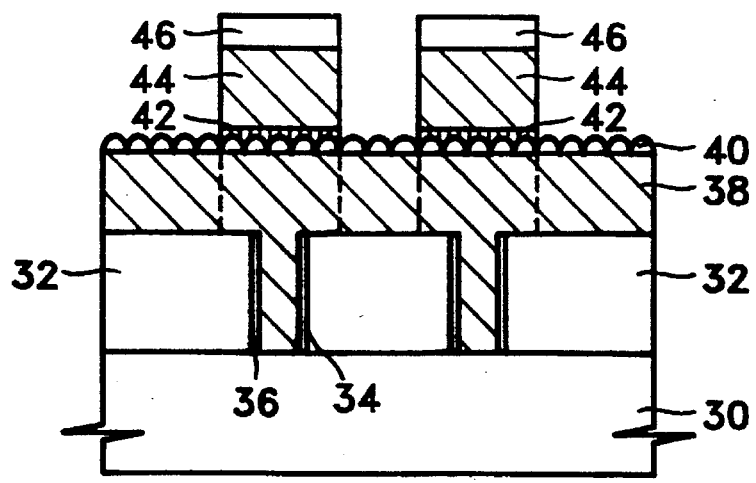

FIG. 7 shows the step of patterning a lower storage node. As shown in FIG. 7, second insulating film 42 and third insulating film 44 are sequentially formed on the overall surface of first HSG film 40. Third insulating film 44 is formed of a polysilicon layer or a nitride layer. A photoresist (not shown) is coated on the overall surface of third insulating film 44. The photoresist is patterned to define the lower storage node. Third insulating film 44 and second insulating film 42 are sequentially dry-etched by using photoresist pattern 46. The etching is performed until first HSG film 40 is exposed. Thereafter, photoresist pattern 46 is removed. Second insulating film 42 protects first HSG film 40 on the lower storage node 38a, shown in FIG. 8, from the etching. When etching first conductive layer 38, third insulating film 44 serves to protect second insulating film 42. In addition, when wet-etching second insulating film 42, third insulating film 44 serves to prevent the contamination of the rear surface of semiconductor substrate 30. The dotted line shown in FIG. 7 represents the path of the etching which will be performed in the subsequent process.

Figure 8:
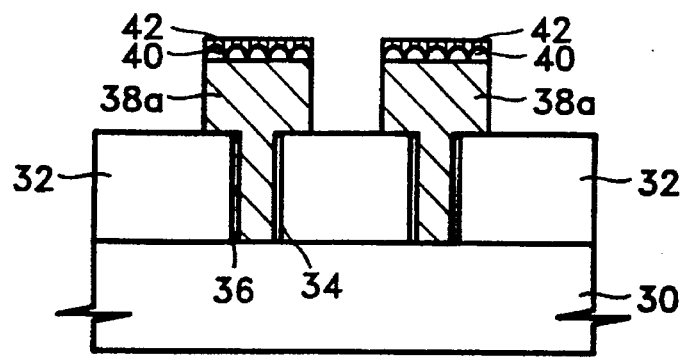

FIG. 8 shows the step of forming the lower storage node 38a. First conductive layer 38 is dry-etched by using third insulating film 44 and second insulating film 42 as a mask, shown in FIG. 7, thereby forming lower storage node 38a. The etching is performed so as not to cause a positive slope, until the interface of first insulating film 32 is exposed. In the process, third insulating film 44 is etched together, thereby protecting second insulating film 42 from etching. Thus, first HSG film 40 remains only on lower storage node 38a.

Figure 9:
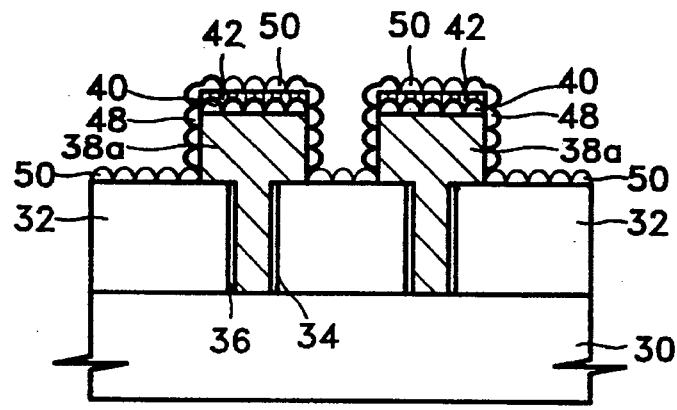

FIG. 9 shows the step of forming the second HSG film. As shown in FIG. 9, second HSG films 48 and 50 are deposited on the overall surface of the resultant structure shown in FIG. 8, by using grains as large as those of first HSG film 40. Second HSG film 50, shown in FIG. 9, is removed, for capacitor reliability, in a subsequent step.

Figure 10:
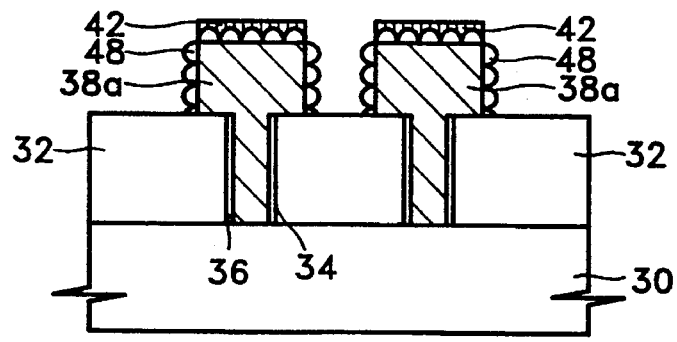

FIG. 10 shows the step of removing second HSG film 50 formed on the overall surface of substrate 30, except for lower storage node 38a. As shown in FIG. 10, the overall surface of the resultant structure, as shown in FIG. 9, is etched back. As a result of the etch-back, second HSG film 50, shown in FIG. 9, is removed. In this step, second insulating film 42 protects first HSG film 40 on lower storage node 38a from the etching-back.

Figure 11:
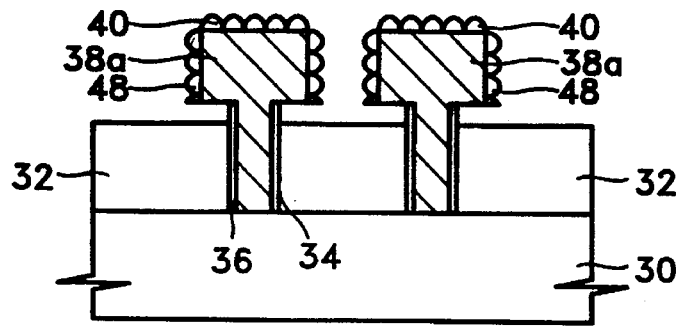

FIG. 11 shows the step of completing lower storage node 38a. As shown in FIG. 11, lower storage node 38a is completed by etching the third layer insulating film of first insulating film 32 and second insulating film 42, shown in FIG. 10, by using a surfactant buffered oxide etchant (SBOE). Thereafter, a high dielectric film (not shown) and an upper storage node (not shown) are formed on lower storage node 38a by a usual method, thereby completing the capacitor.

In the present invention as described above, first HSG film 40 is formed on lower storage node 38a, and second HSG film 48 is formed on a sidewall of lower storage node 38a. Second insulating film 42 for protecting first HSG film 40 is deposited on first HSG film 40. Thus, first HSG film 40 and lower storage node 38a are protected from the etch-back for removing second HSG film 50 formed on the overall surface of substrate 30, except for lower storage node 38a. As a result, first HSG film 40 and lower storage node 38a are prevented from being damaged by the etch-back, and the large capacitance of the capacitor is maintained. Further, the present invention is advantageous in that the manufacturing process is relatively simple, since a simple stack-structured lower storage node is used.

The present invention is not limited to the above embodiment, and it is clearly understood that many variations may be made within the scope and spirit of the present invention, by those skilled in the art.

What is claimed is:

1. A capacitor manufacturing method, comprising the steps of:

forming a first insulating film including a contact hole on a surface of a semiconductor substrate;

forming a first conductive layer on said first insulating film while burying said contact hole;

forming a first HSG film having hemispherical particles of a first size on a surface of said first conductive layer;

sequentially forming a second insulating film and a third insulating film on a surface of said first HSG film;

patterning said second insulating film and said third insulating film;

etching said first HSG film and said first conductive layer by using said patterned third insulating film and second insulating film as a mask to form a lower storage node having said first conductive layer and said HSG film;

removing said third insulating film;

forming a second HSG film having hemispherical particles of substantially the same size as the size of the hemispherical particles in the first HSG film on said second insulating film and said lower storage node;

removing said second HSG film formed around said lower storage node; and removing said second insulating film and at the same time removing a portion of said first insulating film so that said first conductive layer does not contact said first insulating film.

2. A capacitor manufacturing method as claimed in claim 1, wherein said first insulating film has a multi-layer structure.

3. A capacitor manufacturing method as claimed in claim 2, wherein said multi-layer structure is formed from three insulating films.

4. A capacitor manufacturing method as claimed in claim 3, wherein a first insulating film and a third insulating film of said three insulating films are formed from one of an HTO, a BPSG and a USG and a second film of said three insulating films is a nitride film.

5. A capacitor manufacturing method as claimed in claim 1, wherein said third insulating film is formed of one of a polysilicon layer and a nitride layer.

* * * * *